United States Patent [19]

Macksey et al.

[11] Patent Number: 4,616,400
[45] Date of Patent: Oct. 14, 1986

[54] PROCESS FOR FABRICATING A DOUBLE RECESS CHANNEL FIELD EFFECT TRANSISTOR

[75] Inventors: Harry M. Macksey, McKinney; Rick D. Hudgens, Irving, both of Tex.

[73] Assignee: Texas Instruments Incorporated, Dallas, Tex.

[21] Appl. No.: 684,523

[22] Filed: Dec. 21, 1984

[51] Int. Cl.$^4$ .................. H01L 21/203; H01L 21/285
[52] U.S. Cl. ........................................ 29/571; 29/579; 29/580; 29/591; 148/175
[58] Field of Search ................ 29/571, 591, 580, 579; 148/175

[56] References Cited

U.S. PATENT DOCUMENTS

| | | | |
|---|---|---|---|
| 4,301,188 | 11/1981 | Niehaus | 29/571 X |
| 4,503,600 | 3/1985 | Nii et al. | 29/571 |
| 4,551,394 | 11/1985 | Betsch et al. | 148/DIG. 59 |

Primary Examiner—George T. Ozaki
Attorney, Agent, or Firm—Carlton H. Hoel; James T. Comfort; Melvin Sharp

[57] ABSTRACT

Using a process constructed in accordance with the teachings of this invention, a double recess, N+ ledge field effect transistor may be formed using a single masking step. Two layers of photoresist of differing types are formed on the surface of an N+ epitaxial layer. On the surface of these photoresist layers a layer of material which may be etched by reactive ion etching with freon but will not etch by reactive ion etching with oxygen is formed. A gate pattern is etched into this surface layer of material and the photoresist layers are selectively undercut to provide a pattern to etch the gate recess and the wide recess. A gate contact is then formed by perpendicular evaporation through the gate pattern in the surface layer of material. Thus the invention provides a process for forming a self-aligned double recess transistor using a single mask to form the gate, the wide recess and the gate recess, and another mask to form the source and drain contacts.

18 Claims, 15 Drawing Figures

PROCESS FOR FABRICATING A DOUBLE RECESS CHANNEL FIELD EFFECT TRANSISTOR

FIELD OF THE INVENTION

The present invention relates to processes for fabricating field effect transistors. More particularly the present invention relates to processes for forming field effect transistors having a double recess channel structure with an N+ ledge.

BACKGROUND OF THE INVENTION

FIG. 1 is a schematic diagram of a GaAs metal-semiconductor field effect transistor (MESFET) having a double recess channel with an N+ ledge structure. An N+ ledge structure transistor includes raised N+ source and drain regions above an N channel region with the source and drain contacts set back from the edge of the source and drain regions near the recess for the channel region. Epitaxial layer 3 is formed by epitaxial deposition of GaAs onto substrate 1 and buffer layer 2. Source/drain regions 4 are formed by epitaxial deposition of N+ GaAs on the surface of epitaxial layer 3 and etching a wide recess through the epitaxial layer 4 to epitaxial layer 3. This structure may also be formed using ion implantation processes. Gate contact 14, source contact 15 and drain contact 16 are formed using techniques well known in the art. This structure has been shown to have increased resistance to both instantaneous and long-term burnout (see Wemple, Niehaus, Fukui, Irvin, Cox, Hwang, DiLorenzo, and Schlosser, "Long-term and Instantaneous Burnout in GaAs Power FET'S: Mechanisms and Solutions", IEEE Transactions on Electron Devices, Volume ED-28, 834 (July 1981)), and has shown improved performance over conventional field effect transistors (FETs) as power FETs in the microwave range (see Saunier and Shih, "High-Performance K-Band GaAs Power Field-Effect Transistors Prepared By Molecular Beam Epitaxy", Applied Physics Letters, Volume 42, 966 (1 June 1983)).

However, prior processes for fabricating double recess FETs with N+ ledges require two critical masking steps. FIGS. 2A through 2C are schematic diagrams depicting the processing steps necessary to fabricate a double recess, N+ ledge field effect transistor according to the prior art. N+ layer 4 of FIG. 2A is deposited on epitaxial layer 3 by, for example, molecular beam epitaxy, and source contact 16 and drain contact 15 are formed on the surface of N+ layer 4. Photoresist layer 17 is formed and patterned on the surface of N+ layer 4 using techniques well known in the art. Epitaxial layer 4 and a small part of epitaxial layer 3 are then etched using techniques well known in the art and photoresist layer 17 is removed to provide wide recess 21 shown in FIG. 2B. Photoresist layer 18 is then formed and patterned on the surface of N+ layer 4 using techniques well known in the art. N layer 3 is then etched using techniques well known in the art down to the final thickness to provide the structure shown in FIG. 2C. Gate metal contact 14 is then formed on the structure of FIG. 2C and photoresist layer 18 is removed to provide the structure of FIG. 1. Of importance, the process described with reference to FIG. 1 and FIGS. 2A through 2C requires two critical masking steps; these are: patterning photoresist layer 17 and patterning photoresist layer 18. Both of these masking steps must be properly aligned for the transistor to operate properly. As is well known in the art, each masking step introduces additional probability of error in the fabrication of a semiconductor device in an integrated circuit. Thus it is desirable to minimize the number of masking steps used to fabricate a double recess, N+ ledge FET.

SUMMARY OF THE INVENTION

Using a process in accordance with the teachings of this invention, a double recessed, N+ ledge field effect transistor may be formed using a single masking step. Two layers of photoresist of differing types are formed on the surface of an N+ epitaxial layer. On the surface of these photoresist layers a layer of material which can be reactive ion etched with freon but will not be reactive ion etched with oxygen is formed. A gate pattern is etched into this surface layer of material and the photoresist layers are selectively undercut to provide a pattern to etch both the gate recess and the wide recess. The gate contact is formed by perpendicular evaporation of metal through the opening in the layer of material on the photoresist layers.

DETAILED DESCRIPTION

Figure 1:
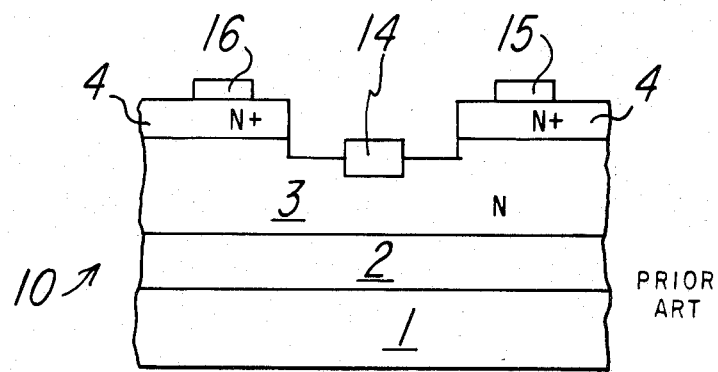
FIG. 1 is a schematic diagram of a prior art double recess, N+ ledge GaAs field effect transistor.
Figure 2A:
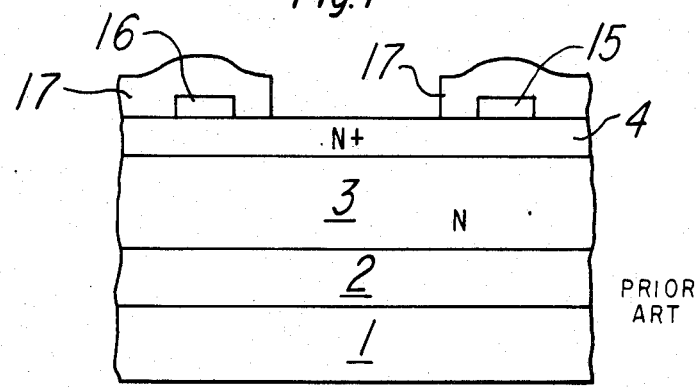
FIGS. 2A through 2C are schematic diagrams depicting the processing steps necessary in the prior art to form GaAs FET 10 of FIG 1.
Figure 2B:
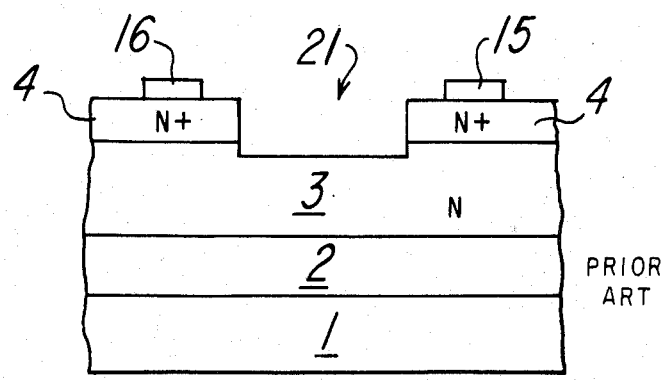
Figure 2C:
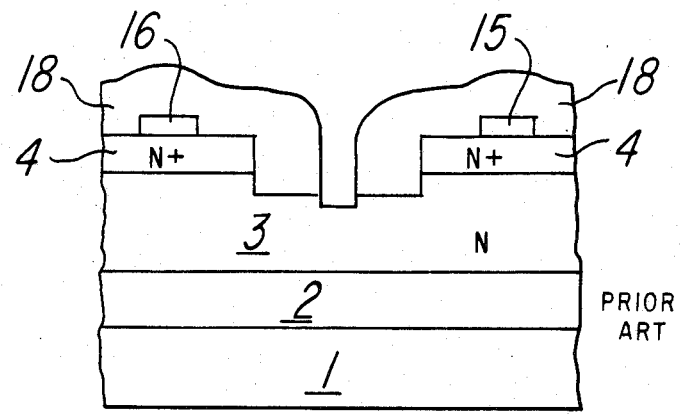
Figure 3A:
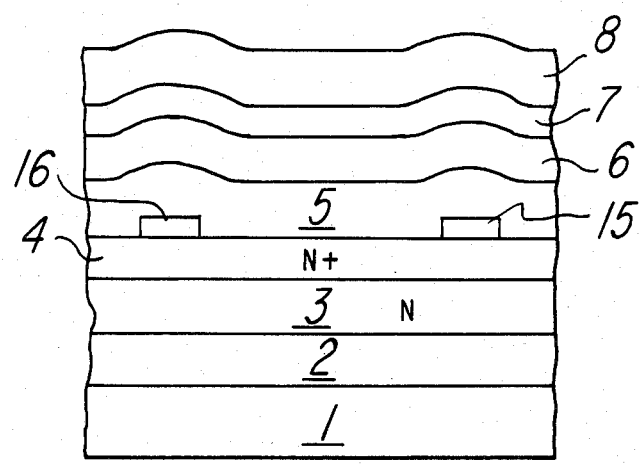
FIGS. 3A through 3K are schematic diagrams depicting the processing steps necessary to fabricate a double recess N+ ledge field effect transistor according to one embodiment of the present invention.

FIGS. 3A through 3K are schematic diagrams depicting one embodiment of a process according to the teachings of this invention. Substrate 1 of FIG. 3A is a semi-insulating GaAs substrate. Buffer region 2 is high resistivity GaAs which is formed by, for example, molecular beam epitaxy on the surface of substrate 1. The substrate 1 can be either P-type or N-type. Layer 3 is an N-type GaAs layer formed on buffer 2 by, for example, molecular beam epitaxy to a thickness of approximately 1000 to 7000 angstroms. Layer 4 is an N+ doped GaAs layer formed by, for example, molecular beam epitaxy to a thickness of approximately 2000 angstroms. Source contact 16 and drain contact 15 are ohmic contacts formed by techniques well known in the art. Resist layer 5 is an optical resist such as AZ 1450B which is formed using techniques well known in the art to a thickness between 5000 and 10,000 angstroms. Layer 6 is a layer of polymethylmethacrylate (PMMA) which is formed on the surface of photoresist layer 5 using techniques well known in the art to a thickness of approximately 2000 to 7000 angstroms. Layer 7 is a layer of germanium which is formed by evaporation to a thickness of approximately 500 angstroms. Germanium is used here because germanium can be reactive ion etched with freon but does not reactive ion etch with oxygen. Other materials which exhibit these properties, such as silicon dioxide, may be substituted for germanium. Layer 8 is a layer of photoresist or electron beam resist material which will be patterned using techniques well known in the art to a pattern conforming to the gate of the field effect transistor (FET) to be formed.

Figure 3B:
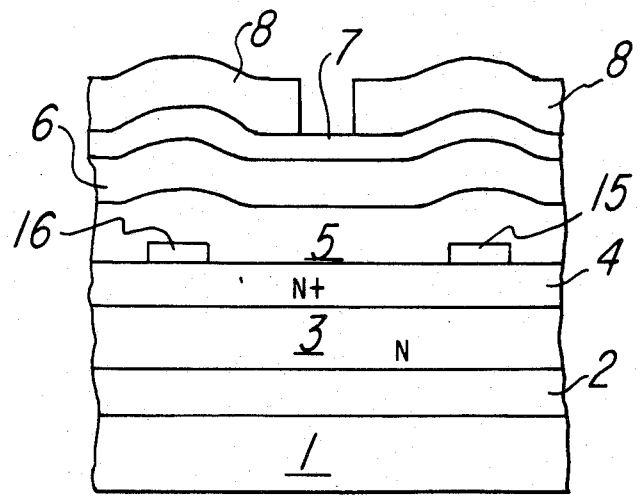
Figure 3C:
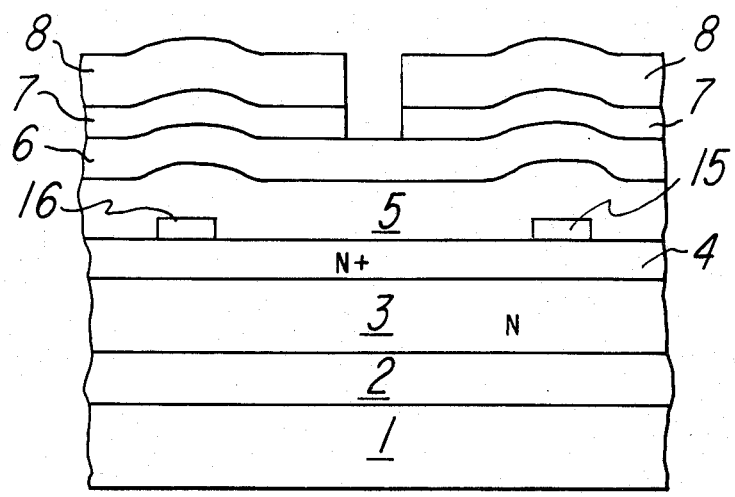
Figure 3D:
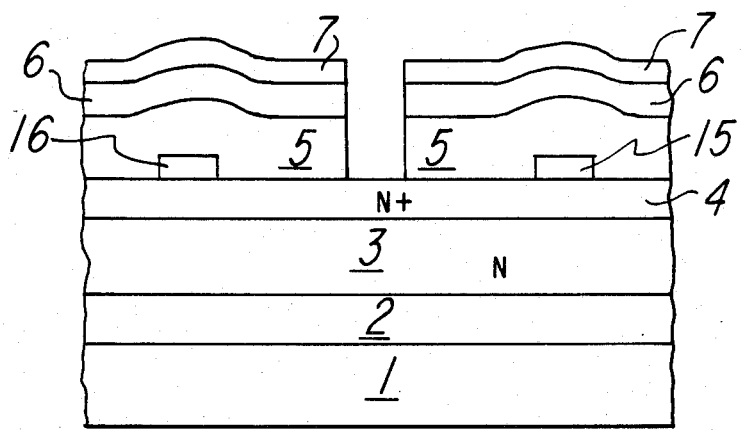

FIG. 3B shows photoresist layer 8 with the pattern of the gate of the FET to be formed. Germanium layer 7 is then etched by reactive ion etching with freon to provide the structure shown in FIG. 3C. Photoresist layer 5 and PMMA layer 6 are vertically etched using reactive ion etching with oxygen. Photoresist layer 8 is removed during the oxygen reactive ion etch to provide the structure shown in FIG. 3D.

Figure 3E:
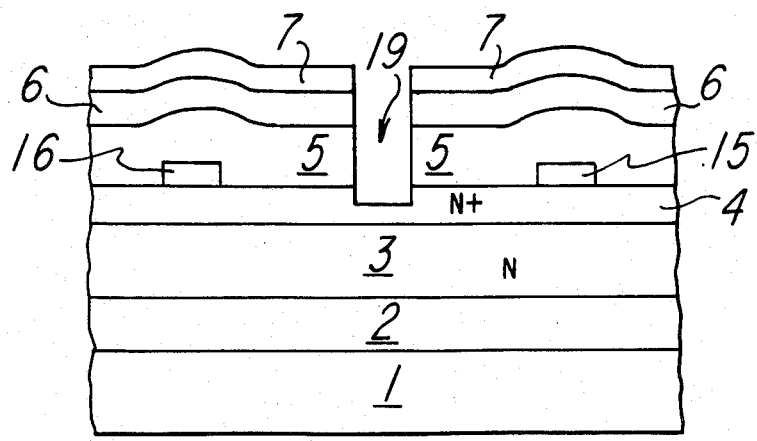
Figure 3F:
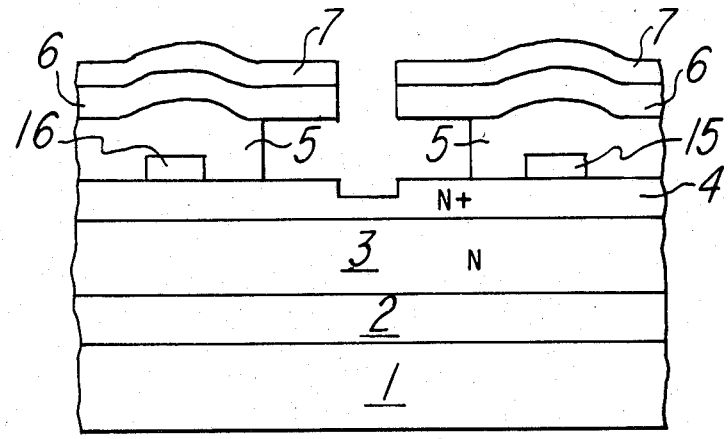
Figure 3G:
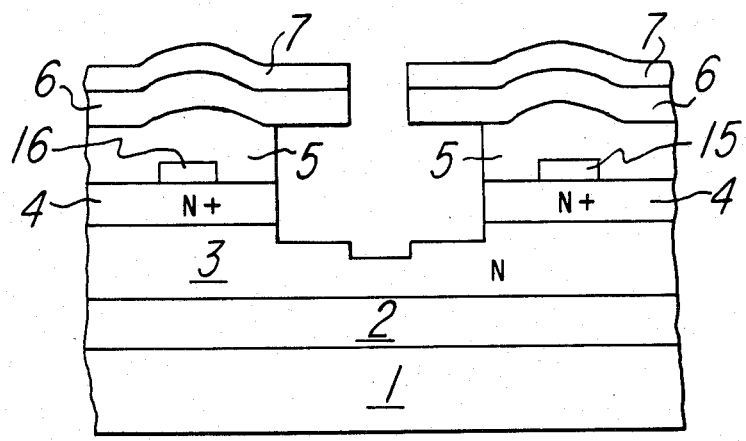
Figure 3H:
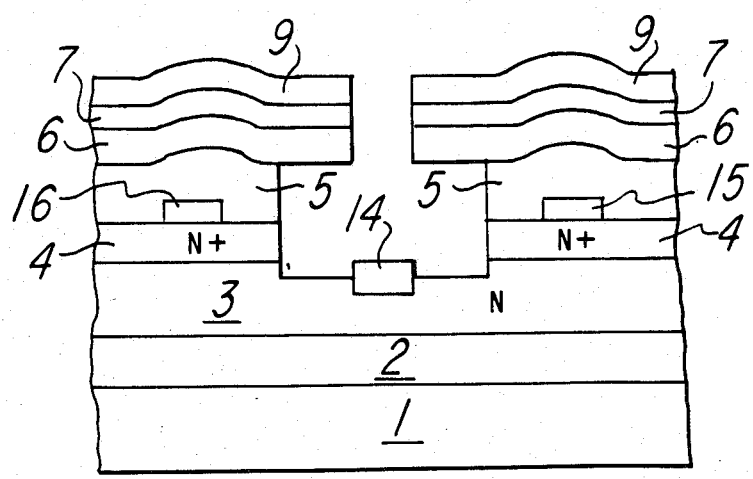

N+ GaAs layer 4 is then chemically etched to provide gate recess 19 as shown in FIG. 3E. Photoresist layer 5 is then etched using a photoresist developer such as AZ 311 to undercut PMMA layer 6 and germanium layer 7. The width of the opening, as shown in FIG. 3F, in photoresist layer 5 is controlled by timing the etch of photoresist layer 5. PMMA layer 6 provides support for germanium layer 7 when PMMA layer 6 is undercut. N+ GaAs layer 4 and N GaAs layer 3 are then chemically etched to provide the structure shown in FIG. 3G. The structure of FIG. 3G is then subjected to an evaporation of metal, such as a three layer evaporation of titanium, platinum and gold, from a metal evaporation source perpendicular to the surface of the structure shown in FIG. 3G to provide gate 14 and metal layer 9 as shown in FIG. 3H.

Figure 3I:
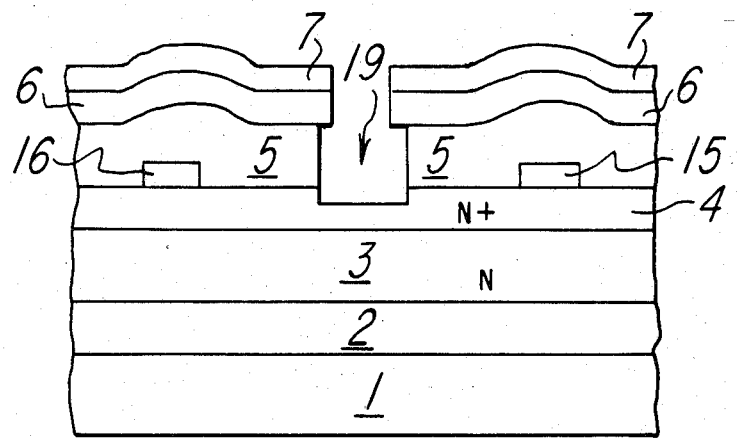
Figure 3J:
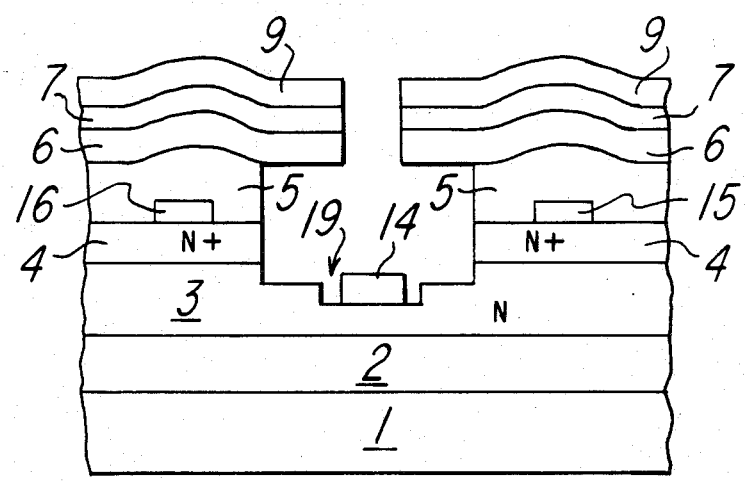

In an alternative embodiment, photoresist layer 5 is widened using photoresist developer before gate recess 19 is etched into N+ GaAs layer 4, thus providing the structure shown in FIG. 3I. After the processing steps described with regard to FIGS. 3F, 3G and 3H, this alternative embodiment will provide the structure shown in FIG. 3J in which gate recess 19 is wider than gate metallization 14. This provides the desirable characteristic of lower gate capacitance which is useful in certain situations.

Figure 3K:
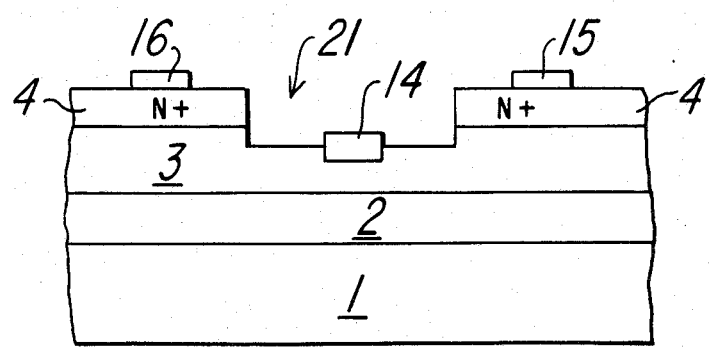

After the formation of gate 14, photoresist layers 5 and PMMA layer 6 are rinsed away in a solvent thus lifting off metal layer 9 (FIG. 3H) to provide the structure shown in FIG. 3K. Thus double recess N+ ledge field effect transistor 20 is formed using a single masking step to form wide recess 21, gate recess 19 and gate 14 which are all self-aligned. A noncritical masking step is necessary to form source contact 15 and drain contact 16. Thus using the above-described process, a double recess N+ ledge field effect transistor is formed using one critical masking step and one noncritical masking step rather than two critical masking steps and one noncritical masking step as was necessary in the prior art.

Although this specification describes specific embodiments of the present invention, it is not to be construed as limiting the scope of the invention. Other embodiments of the invention will become evident to those skilled in the art in light of the teachings of this invention.

TECHNICAL ADVANTAGES

The present invention teaches a process for fabricating a double recess channel field effect transistor using a single mask which self aligns gate contact, gate recess and wide recess of a double recess channel field effect transistor. This contrasts with the prior art which requires two critically aligned mask steps.

We claim:

1. A process for forming a double recess field effect transistor, comprising the steps of:
   (a) providing a semiconductor structure having a first semiconductor layer of a first conductivity type, a second more highly doped semiconductor layer thereover of said first conductivity type, source and drain contacts on said second semiconductor layer, a first masking layer over said second layer and said contacts, a support layer over said masking layer, an etchable layer over said support layer and a second masking layer over said etchable layer;
   (b) forming a mask in said second masking layer and between said source and drain contacts;
   (c) etching away said etchable layer portion beneath said mask with an etchant specific thereto relative to said support layer;
   (d) etching away said support layer and said first masking layer portions beneath said mask with an etchant specific thereto relative to said second semiconductor layer;
   (e) etching away a portion of the second semiconductor layer portion beneath said mask;
   (f) removing a portion of said first masking layer beneath said support layer, the second semiconductor layer portion beneath said just removed portion of said first masking layer and a portion of said first semiconductor layer beneath said portion of said second semiconductor layer beneath said mask;
   (g) depositing a electrically conductive material through said mask in said portion of said first semiconductor layer beneath said mask; and
   (h) removing said first masking layer and all material thereabove.

2. A process as in claim 1 wherein said first conductivity type is N-type.

3. A process as in claim 1 wherein said first conductivity type is P-type.

4. The process of claim 1 wherein said first masking layer is a photoresponsive material.

5. The process of claim 4 wherein said support layer and said etchable layer are formed of materials for which there is an etchant selective to said etchable layer relative to said support layer.

6. The process of claim 5 wherein the etchant of step (c) is Freon and said etchable layer is formed of germanium.

7. The process of claim 6 wherein the etchant of step (d) is reactive ion etching with oxygen, said first masking layer is a photoresponsive layer etchable by said reactive ion etching with oxygen and said support layer is polymethylmethacrylate.

8. The process of claim 5 wherein the etchant of step (d) is reactive ion etching with oxygen, said first masking layer is a photoresponsive layer etchable by said reactive ion etching with oxygen and said support layer is polymethylmethacrylate.

9. The process of claim 4 wherein the etchant of step (c) is Freon and said etchable layer is formed of germanium.

10. The process of claim 9 wherein the etchant of step (d) is reactive ion etching with oxygen, said first masking layer is a photoresponsive layer etchable by said reactive ion etching with oxygen and said support layer is polymethylmethacrylate.

11. The process of claim 4 wherein the etchant of step (d) is reactive ion etching with oxygen, said first masking layer is a photoresponsive layer etchable by said reactive ion etching with oxygen and said support layer is polymethylmethacrylate.

12. The process of claim 1 wherein said support layer and said etchable layer are formed of materials for which there is an etchant selective to said etchable layer relative to said support layer.

13. The process of claim 12 wherein the etchant of step (c) is Freon and said etchable layer is formed of germanium.

14. The process of claim 13 wherein the etchant of step (d) is reactive ion etching with oxygen, said first masking layer is a photoresponsive layer etchable by said reactive ion etching with oxygen and said support layer is polymethylmethacrylate.

15. The process of claim 12 wherein the etchant of step (d) is reactive ion etching with oxygen, said first masking layer is a photoresponsive layer etchable by said reactive ion etching with oxygen and said support layer is polymethylmethacrylate.

16. The process of claim 1 wherein the etchant of step (c) is Freon and said etchable layer is formed of germanium.

17. The process of claim 16 wherein the etchant of step (d) is reactive ion etching with oxygen, said first masking layer is a photoresponsive layer etchable by said reactive ion etching with oxygen and said support layer is polymethylmethacrylate.

18. The process of claim 1 wherein the etchant of step (d) is reactive ion etching with oxygen, said first masking layer is a photoresponsive layer etchable by said reactive ion etching with oxygen and said support layer is polymethylmethacrylate.

* * * * *